(12) United States Patent
Kawahara

(10) Patent No.: US 6,521,505 B2
(45) Date of Patent: *Feb. 18, 2003

(54) MANUFACTURING METHOD OF SEMICONDUCTOR DEVICE

(75) Inventor: Naoyoshi Kawahara, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/389,496

(22) Filed: Sep. 3, 1999

(65) Prior Publication Data

US 2002/0025674 A1 Feb. 28, 2002

(30) Foreign Application Priority Data

Sep. 10, 1998 (JP) .............................. 10-257025

(51) Int. Cl.[7] ............................................. H01L 21/331
(52) U.S. Cl. ..................... 438/365; 438/592; 438/649
(58) Field of Search ................... 438/592, 647, 438/648, 649, 682, 683, 365, 364, 366, 367, 368, 309

(56) References Cited

U.S. PATENT DOCUMENTS

| | | | |
|---|---|---|---|
| 4,977,098 A | * | 12/1990 | Yu et al. |
| 5,953,633 A | * | 9/1999 | Chen et al. ................. 438/682 |
| 6,022,805 A | * | 2/2000 | Sumi ........................... 438/677 |

FOREIGN PATENT DOCUMENTS

| | | |
|---|---|---|
| JP | 63-79376 | 4/1988 |
| JP | 4-303963 | 10/1992 |
| JP | 5-182925 | 7/1993 |
| JP | 5-347267 | 12/1993 |
| JP | 6-283674 | 10/1994 |
| JP | 7-58124 | 3/1995 |
| JP | 8-288397 | 11/1996 |

* cited by examiner

Primary Examiner—Tuan H. Nguyen
(74) Attorney, Agent, or Firm—Young & Thompson

(57) ABSTRACT

In forming transistor electrodes, after a polysilicon film is formed, RF plasma etching is applied to the surface thereof to remove a natural oxidation film on the surface of the polysilicon film.

6 Claims, 7 Drawing Sheets

MANUFACTURING METHOD OF SEMICONDUCTOR DEVICE

BACKGROUND OF THE INVENTION

1. Field of the Invention

The present invention relates to a semiconductor device having an electrode with a layered structure of polysilicon and metal or metal silicide, for instance, an electrode made of polycide.

2. Description of the Related Art

In recent years, with the purpose of satisfying demands that elements should have still higher speed, the metal such as tungsten and the metal silicide such as tungsten silicide have become being utilized as an electrode material. For instance, an electrode made of polycide that is structurally layers of polysilicon and silicide is in wide use.

FIG. 3 shows a conventional method of manufacturing a portion around an emitter electrode for a bipolar transistor. First, field oxide films 101 each of which is to serve as an element isolation region are formed, on a semiconductor substrate 1, to a thickness of 500 nm or so. Then, an $N^+$-buried collector region 2, an $N^-$-collector region 3, an $N^+$-collector region 4 and a P-base region 5 are formed, in succession, each by performing the ion implantation through a mask formed from the resist using the method of photolithography (FIG. 3($a$)). Next, as shown in FIG. 3($b$), an insulating film 102 is formed, and by means of photolithography a region which is to be an emitter electrode section is patterned thereon, and an opening is made therethrough by plasma etching using the photoresist as a mask, and thereafter a polysilicon film 103 is grown to a thickness of 150 nm or so. Next, arsenic is ion-implanted into the polysilicon film 103 and a subsequent heat treatment diffuses the arsenic into the silicon substrate, forming an $N^+$-emitter region 6. If the polysilicon film 103 is exposed to the air at this point, a natural oxidation film 104 is brought to grow on the surface of polysilicon, as shown in FIG. 3($c$).

Further, after a tungsten silicide film 105 is formed over the polysilicon film 103, the plasma etching is selectively applied thereto through a mask of the photoresist and thereby a polycide emitter electrode is formed (FIG. 4). Subsequently, electrodes are formed in a base, a collector and an emitter region, respectively, by the conventional techniques, which accomplishes a bipolar transistor.

SUMMARY OF THE INVENTION

The emitter electrode of the bipolar transistor manufactured by the above-mentioned prior art, however, has a natural oxidation film lying between the polysilicon film 103 and the tungsten silicide film 105, as shown in FIG. 4. This gives rise to a problem that the value of resistance for the emitter electrode thereof becomes high, for the natural oxidation film has high resistance.

Accordingly, an object of the present invention is, in an electrode with a layered structure of polysilicon and metal or metal silicide, for instance, an electrode made of polycide, to remove a high-resistance layer such as a natural oxidation film and lower the value of resistance for the electrode.

In light of the above problem, the present invention provides a method of manufacturing a semiconductor device; which comprises the steps of:

(a) forming an insulating film on the surface of a silicon substrate, and thereafter forming a polysilicon film over said insulating film;

(b) applying the plasma etching to the surface of said polysilicon film, using the inert gas;

(c) forming a metal film over said polysilicon film; and (d) patterning said metal film and polysilicon film, and thereby forming an electrode.

In the manufacturing method of a semiconductor device according to the present invention, when an electrode with a layered structure of polysilicon and metal or metal silicide, for instance, an electrode made of polycide, is formed, a polysilicon film is first formed and thereafter the plasma etching is applied to the surface thereof, using the inert gas. Consequently, such a high-resistance layer formed over the surface of the polysilicon film as the natural oxidation film is removed. In an electrode made of polycide or the like, because a current flows along a direction perpendicular to the layered structure, the state of the interface between the polysilicon and the metal film (silicide or the like) strongly affects the value of resistance for the electrode. Therefore, the above-mentioned removal of the high-resistance layer can lower the electrode resistance with effect.

In short, in the present invention, after the formation of a polysilicon film, the plasma etching with the inert gas is applied to the surface thereof so that a high-resistance layer on the surface of polysilicon can be removed, which enables to lower the value of the electrode resistance.

DETAILED DESCRIPTION OF THE PREFERRED EMBODIMENTS

In the present invention, the plasma etching carried out in step (b) removes, for instance, a natural oxidation film formed on the surface of a polysilicon film in step (a). If the polysilicon film is exposed, after grown, to the atmosphere containing oxygen in step (a), the natural oxidation film is formed on the surface thereof. The removal of this natural oxidation film is the main object of the etching in step (b).

With regard to the method of this etching, the plasma etching with the inert gas is employed. For the inert gas, it is preferable to use, for instance, argon. The use of such an etching method allows an effective removal of the natural oxidation film and secures readily an appropriate selection ratio to the underlying polysilicon film. Further, this etching step and its following step of depositing a metal film of tungsten or the like by sputtering can be performed successively in the same equipment and, in this way, the process efficiency can be improved.

In the present invention, step (a) may comprise forming said insulating film and thereafter making an opening through a prescribed section of the insulating film and subsequently forming a polysilicon film thereon. In other words, structurally, the electrode and an impurity diffusion layer may come into a direct contact, not over an insulating film. Accordingly, the manufacturing method of the present invention can apply to, for example, the formation of an electrode in a bipolar transistor.

The electrode in the present invention can be any of various electrodes utilized in semiconductor elements, but is preferably an electrode through which a current flows, when in use. For example, an emitter electrode of a bipolar transistor or the like is preferable. This is explained from a fact that the application of the method of the present invention to the formation of such an electrode particularly well brings out the effect of the present invention to lower the electrode resistance.

As for the material to compose the metal film in the present invention, the low-resistance metal material is used. For instance, one or more kinds of materials selected from the group consisting tungsten, aluminium, copper, tungsten silicide, titanium silicide, molybdenum silicide and cobalt silicide are preferably utilized.

EXAMPLES

Example 1

Figure 1A:
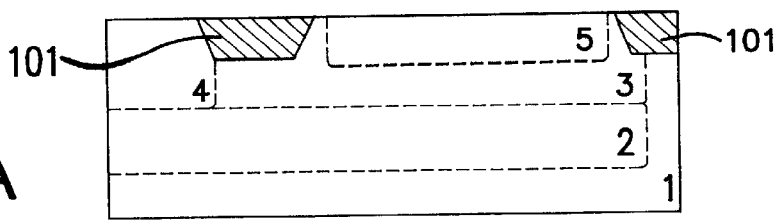
FIGS. 1($a$)–1($d$) is a series of schematic sectional views illustrating the steps of a manufacturing method of a semiconductor device according to the present invention.

The present example is one example of the method of manufacturing an emitter electrode in a bipolar transistor. Referring to FIG. 1 and FIG. 2, the present example is described below.

Figure 1B:
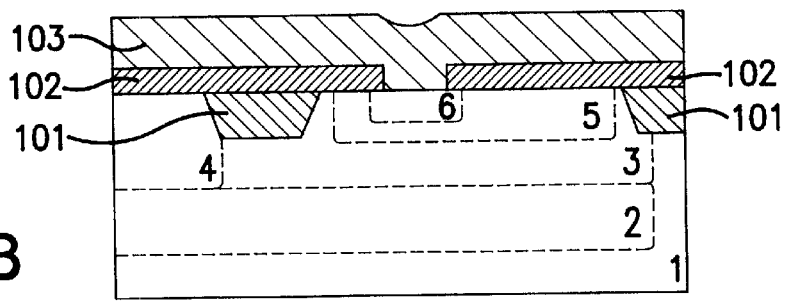
Figure 4:
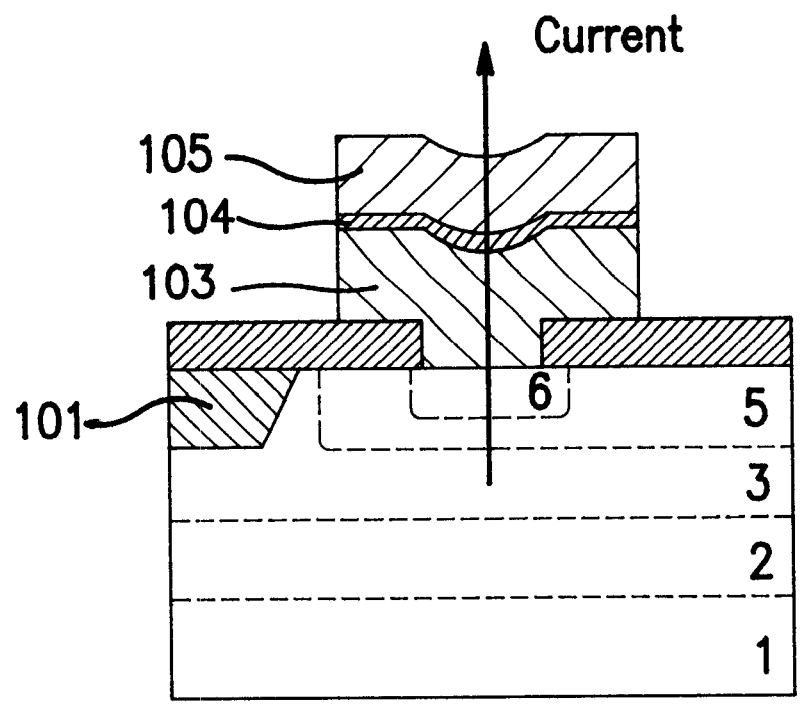
FIG. 4 is a schematic sectional view showing the structure of a semiconductor device manufactured in the conventional manufacturing method of a semiconductor device.

In the present example, as shown in FIG. 1(b), after a polysilicon film 103 is grown to a thickness of 100 to 150 nm and immediately before a tungsten silicide film 105 is formed, the RF plasma etching is performed for 50 to 100 seconds, using argon gas. By this etching, a high-resistance layer (a natural oxidation film) on the surface of polysilicon is removed. Then, by sputtering tungsten to a thickness of 150 to 200 nm and, subsequently, applying a heat treatment thereto, a tungsten silicide film 105 is formed. In forming this polycide, if the high-resistance layer 104 is present lying over the interface between polysilicon and silicide, as shown in FIG. 4, the value of resistance for the emitter electrode at the time when a current flows in a direction perpendicular to layers becomes high. With the RF plasma etching performed as shown in FIG. 1(d), however, the high-resistance layer over the interface between polysilicon and silicide can be removed and thereby the emitter resistance, reduced.

Next, every step in the method of manufacturing a bipolar transistor that relates to the present invention is described.

First, as shown in FIG. 1(a), field oxide films 101 each of which is to serve as an element isolation region are formed, on a semiconductor substrate 1, to a thickness of 500 nm or so. Then, an N$^+$-buried collector region 2, an N$^-$-collector region 3, an N$^+$-collector region 4 and a P-base region 5 are formed, in succession, each by performing the ion implantation through a mask formed from the resist using the method of photolithography.

Next, as shown in FIG. 1(b), an insulating film 102 is formed, and by means of photolithography a region which is to be an emitter electrode section is patterned thereon, and an opening is made therethrough by plasma etching using the photoresist as a mask, and thereafter a polysilicon film 103 is grown to a thickness of 100 to 150 nm. Next, arsenic is ion-implanted implanted into the polysilicon film 103 and a subsequent heat treatment diffuses the arsenic into the silicon substrate, forming an N$^+$-emitter region 6.

Figure 1C:
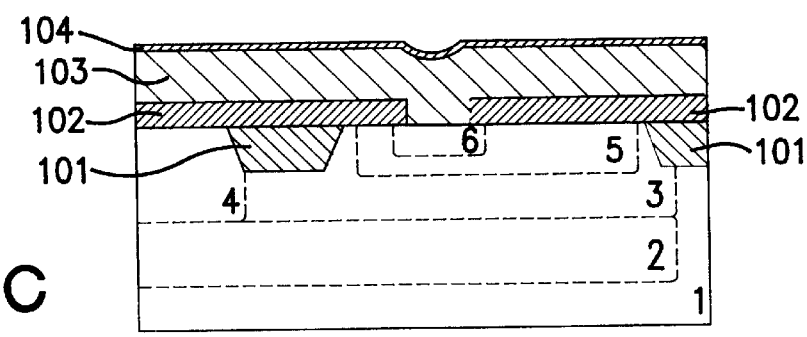
Figure 1D:
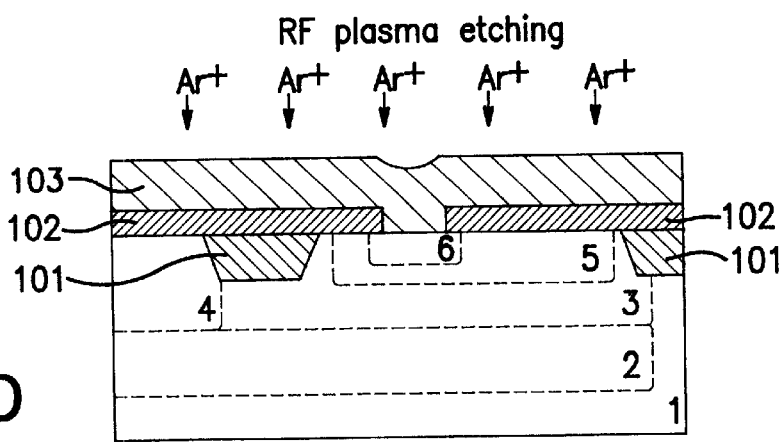
Figure 2:
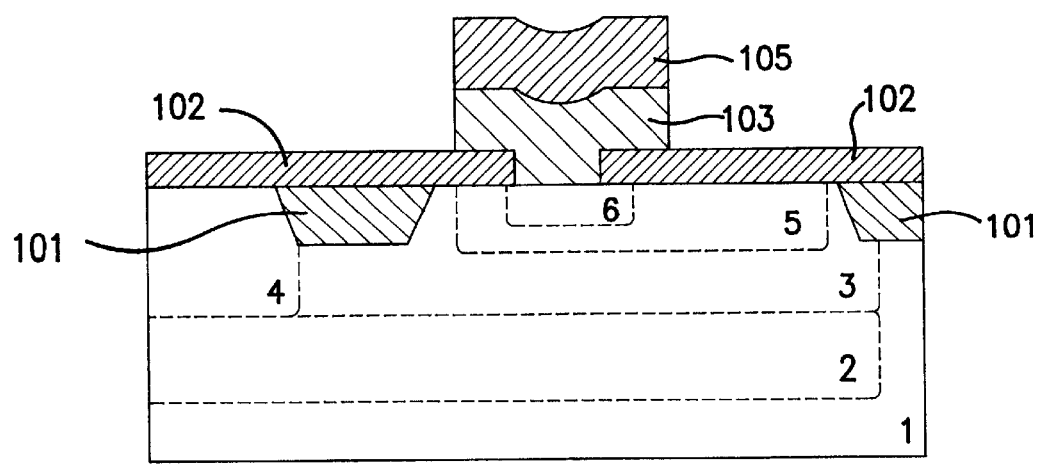
FIG. 2 is a schematic sectional view showing the structure of a semiconductor device manufactured in the manufacturing method of a semiconductor device according to the present invention.
Figure 3A:
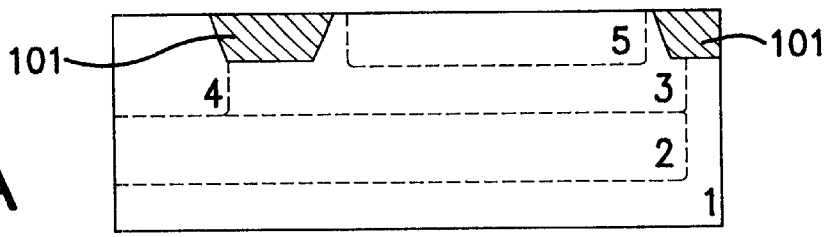
FIGS. 3($a$)–3($c$) is a series of schematic sectional views illustrating the steps of a conventional manufacturing method of a semiconductor device.
Figure 3B:
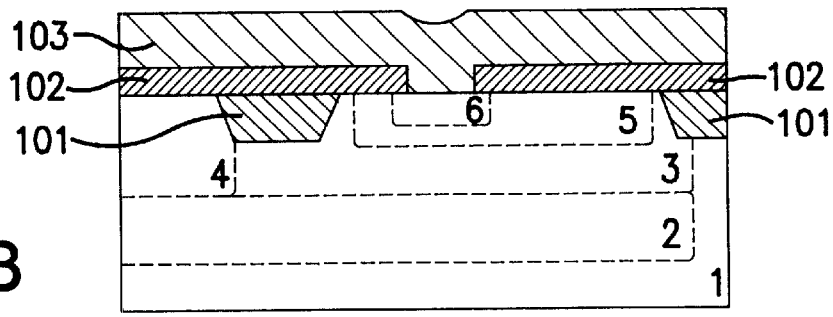
Figure 3C:
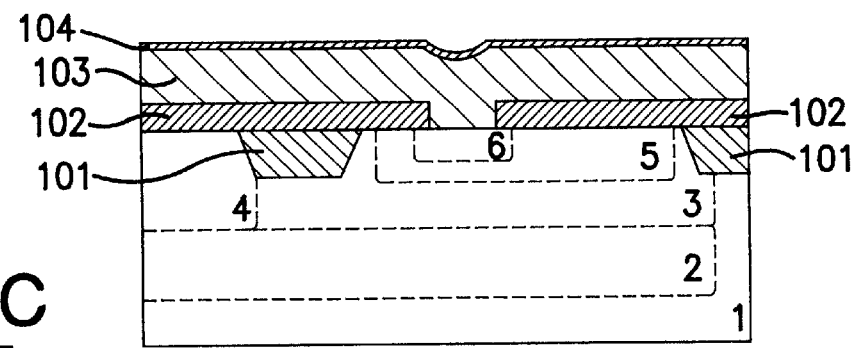

If the polysilicon film 103 is exposed to the air at this point, a natural oxidation film 104 is brought to grow on the surface of polysilicon, as shown in FIG. 1(c). Thus, as shown in FIG. 1(d), the RF plasma etching with argon gas is performed for 50 to 100 seconds in a sputtering equipment and thereby the natural oxidation film 104 is removed. Following this, in the same sputtering equipment, tungsten is deposited by the sputtering method and thereafter, applying a heat treatment thereto, a tungsten silicide film 105 is formed to a thickness of 150 to 200 nm.

Further, as shown in FIG. 2, the plasma etching is selectively applied thereto through a mask of the photoresist and thereby a polycide emitter electrode is formed. Subsequently, electrodes are formed in a base, a collector and an emitter region, respectively, by the conventional techniques, which accomplishes a bipolar transistor.

Now, the value of resistance for an emitter electrode of a bipolar transistor manufactured in the method of the present example was measured, with a current applied thereto. The result indicated that the value of resistance was 65 Ω or so and the present example achieved to reduce the resistance by approximately 30%, considering the value of resistance for an emitter electrode manufactured in a conventional method without removing the natural oxidation film was 90 Ω or so when measured in the same manner. In addition, the comparison of the common-emitter forward current gains $h_{FE}$ showed that the $h_{FE}$ of bipolar transistors manufactured within the plane of one wafer in the method of the present example varied in the range of 50 to 70, while the $h_{FE}$ of bipolar transistors manufactured within the plane of one wafer in a conventional method varied in the range of 50 to 110. This confirmed that the degree of dispersion in the $h_{FE}$ within the plane of one wafer was reduced in the present example.

Example 2

The present example is an example wherein the present invention is applied to a BiCMOS (Bipolar-Complementary Metal-Oxide-Semiconductor) integrated circuit for which further formation of a bipolar transistor into a CMOS (Complementary Metal-Oxide-Semiconductor) integrated circuit can be realized by the minimum extra steps added to the original steps of the manufacturing method thereof.

Figure 5A:
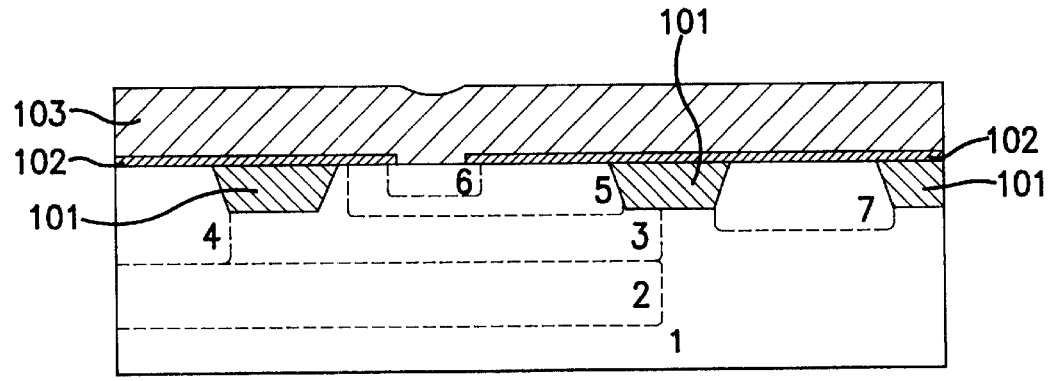
FIGS. 5($a$)–5($d$) is a series of schematic sectional views illustrating the steps of another manufacturing method of a semiconductor device according to the present invention.
Figure 5B:
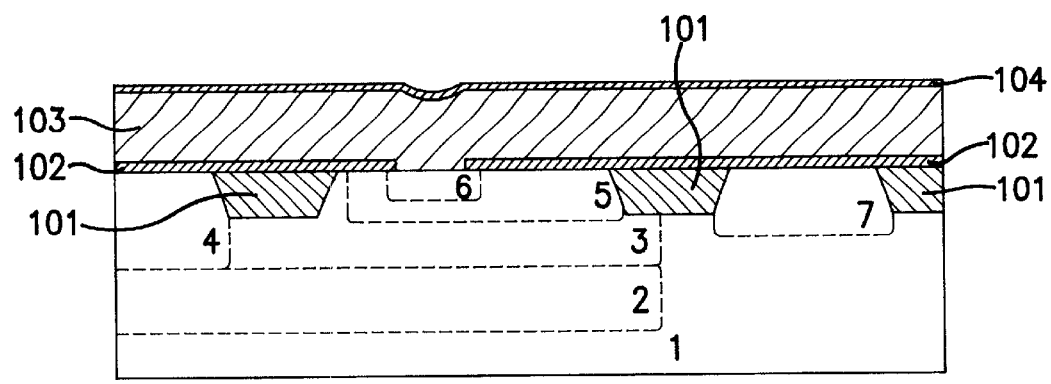

First, as shown in FIG. 5(a), field oxide films 101 each of which is to serve as an element isolation region are formed, on a semiconductor substrate 1, to a thickness of 500 nm or so. Then, an N$^+$-buried collector region 2, an N$^-$-collector region 3, an N$^+$-collector region 4 and a P-base region 5 for a bipolar transistor and an impurity-diffusion layer of a P-well region 7 for an NMOS (N-channel MOS) transistor are formed, in succession, each by means of the ion implantation using a mask of the photoresist. Although not shown in the drawings, an N-well region for a PMOS (P-channel MOS) transistor is also formed similarly. Next, by carrying out the thermal oxidation, a gate oxide film 102 in the MOS section is formed. Then, in order to form a region which is to be an emitter section of the bipolar transistor, an opening is made through the oxide film 102, using the photoresist as a mask, and thereafter a polysilicon film 103 is grown to a thickness of 150 nm or so. An N$^+$-emitter region 6 is formed, in the same way as Example 1, by ion implantation and a heat treatment. If the polysilicon film 103 is exposed to the air at this point, a natural oxidation film 104 is brought to grow on the surface of polysilicon, as shown in FIG. 5(b).

Figure 5C:
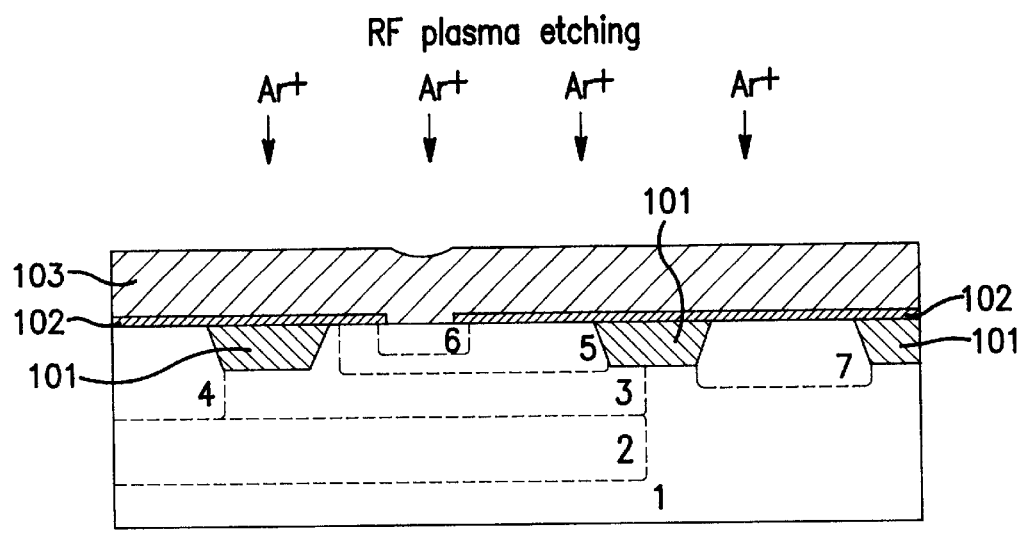
Figure 5D:
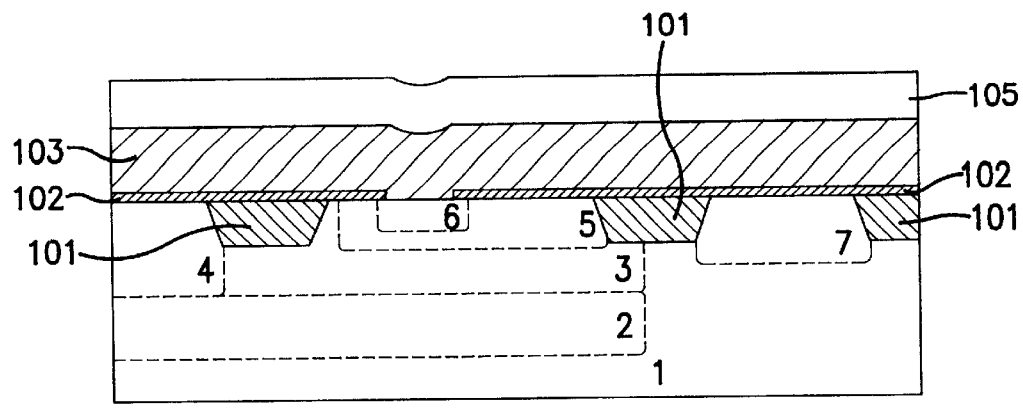

Then, as shown in FIG. 5(c), the RF plasma etching with argon gas is performed for 50 to 100 seconds in a sputtering equipment and thereby the natural oxidation film 104 is removed. Following this, as shown in FIG. 5(d), in the same sputtering equipment, tungsten is deposited by the sputtering method and thereafter, applying a heat treatment thereto, a tungsten silicide film 105 is formed to a thickness of 150 nm or so.

Figure 6:
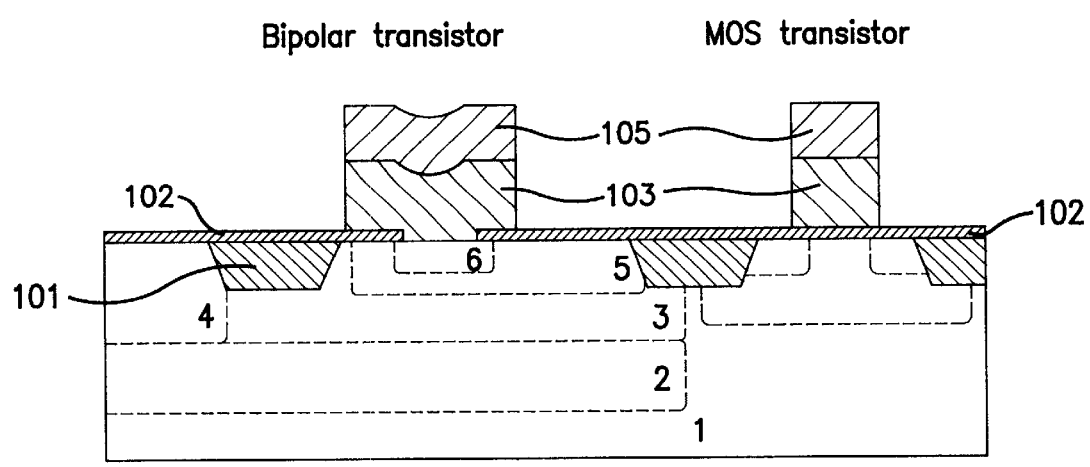
FIG. 6 is a schematic sectional view showing the structure of a semiconductor device manuactured in the manufacturing method of a semiconductor device according to the present invention.

Further, as shown in FIG. 6, the plasma etching is selectively applied thereto through a mask of the photoresist and thereby a polycide emitter electrode of the bipolar transistor and a polycide gate electrode of the MOS transistor are simultaneously formed. Subsequently, a base, a collector and an emitter electrode in the bipolar section and a source, a drain and a gate electrode in the MOS section are formed by the conventional techniques, which accomplishes a BiCMOS integrated circuit. It was confirmed that the resistance for the emitter electrode of the bipolar transistor manufactured in the method of the present example was reduced, in comparison with that for the emitter electrode manufactured in a conventional method without removing the natural oxidation film.

Originally, in the CMOS process, while a voltage is applied to the polycide gate electrode, little current flows through the electrode. Consequently, even if a high-resistance layer lies over the interface between polysilicon and silicide, no problem arises. In the case that a polycide emitter electrode of a bipolar transistor is formed at the same time, however, it is necessary to remove this high-resistance layer and the RF plasma etching is a very effective means for this purpose.

This application is based on application No. HEI10-257025, the content of which is incorporated hereinto by reference.

What is claimed is:

1. A method of manufacturing a semiconductor device, comprising the steps of:
    forming an insulating film on the surface of a silicon substrate, making an opening at a predetermined point of said insulating film, and forming a polysilicon film on said insulating film;
    subjecting said polysilicon film to ion implanation and heat-treating the entire substrate;
    in a first equipment chamber, plasma etching said surface using an inert has to remove a natural oxidation film formed on the surface of said polysilicon film from exposure to the atmosphere after said heat treatment in a sputtering equipment;
    in the same first equipment chamber and without exposing the polysilicon film to the atmosphere, forming a metal film on said polysilicon film; and
    patterning said metal film and polysilicon film to form an emitter electrode of a bipolar transistor.

2. The method of manufacturing a semiconductor device according to claim 1, wherein said inert gas is argon.

3. The method of manufacturing a semiconductor device according to claim 1, wherein said metal film comprises one or more kinds of materials selected from the group consisting of tungsten, aluminum, copper, tungsten silicide, titanium silicide, molybdenum silicide and cobalt silicide.

4. A method of manufacturing a semiconductor device, comprising the steps of:
    forming an insulating film on the surface of a silicon substrate provided with a collector region and a base region, making an opening in said base region of said insulating film, and forming a polysilicon film on said insulating film;
    subjecting said polysilicon film to ion implantation, heat-treating the entire substrate, and thereby forming an emitter region in said base region;
    in a first equipment chamber, plasma etching said surface using an inert gas to remove a natural oxidation film formed on the surface of said polysilicon film from exposure to the atmosphere after said heat treatment in a sputtering equipment;
    in the same first equipment chamber and without exposing the polysilicon film to the atmosphere, forming a metal film on said polysilicon film; and
    patterning said metal film and polysilicon film to form an emitter electrode of a bipolar transistor.

5. The method of manufacturing a semiconductor device according to claim 4, wherein said inert gas is argon.

6. The method of manufacturing a semiconductor device according to claim 4 wherein said metal film comprises one or more kinds of materials selected from the group consisting of tungsten, aluminum copper, tungsten silicide, titanium silicide, molybdenum silicide and cobalt silicide.

* * * * *